(12) United States Patent
Moon et al.

(10) Patent No.: US 8,302,044 B2
(45) Date of Patent: Oct. 30, 2012

(54) ABSTRACTION-BASED LIVELOCK/DEADLOCK CHECKING FOR HARDWARE VERIFICATION

(75) Inventors: In-Ho Moon, Portland, OR (US); Kevin Harer, Cornelius, OR (US)

(73) Assignee: Synopsys, Inc., Mountain View, CA (US)

( * ) Notice: Subject to any disclaimer, the term of this patent is extended or adjusted under 35 U.S.C. 154(b) by 98 days.

(21) Appl. No.: 13/015,006

(22) Filed: Jan. 27, 2011

(65) Prior Publication Data

US 2012/0198397 A1 Aug. 2, 2012

(51) Int. Cl.
*G06F 9/455* (2006.01)
*G06F 17/50* (2006.01)
(52) U.S. Cl. ........................ 716/106; 716/136
(58) Field of Classification Search .................. 716/106, 716/113
See application file for complete search history.

(56) References Cited

U.S. PATENT DOCUMENTS

2008/0172217 A1* 7/2008 Morizawa ..................... 703/13

* cited by examiner

*Primary Examiner* — Suresh Memula
(74) *Attorney, Agent, or Firm* — Park, Vaughan, Fleming & Dowler LLP; Laxman Sahasrabuddhe

(57) ABSTRACT

Some embodiments of the present invention provide systems and techniques for checking a livelock in a circuit design. During operation, the system can identify a finite state machine (FSM) in the circuit design, wherein the FSM comprises a first set of state variables. The system can then construct an abstract machine of the circuit design, wherein the abstract machine includes the FSM and a second set of state variables. Next, the system can search for one or more livelocks in the abstract machine. If a livelock is found in the abstract machine, the system can verify that the livelock is a livelock in a concrete machine of the circuit design, wherein the concrete machine includes the FSM and a third set of state variables, wherein the second set of state variables is a subset of the third set of state variables.

27 Claims, 10 Drawing Sheets

ABSTRACTION-BASED LIVELOCK/DEADLOCK CHECKING FOR HARDWARE VERIFICATION

BACKGROUND

1. Technical Field

This disclosure relates to electronic design automation (EDA). Specifically, this disclosure relates to methods and systems for performing an abstraction-based livelock/deadlock checking for a circuit design during a formal verification of the design.

2. Related Art

Livelock/deadlock checking is a difficult problem in hardware verification. A "livelock" refers to a set of states from which there is no path going to any other state that is reachable from the initial states of a design. In other words, when a design reaches a livelock, the design becomes permanently stuck at one or a few states. Note that a "deadlock" is a special case of the livelock when the number of states in the livelock is one. On the other hand, a "toggle deadlock" is a state for a sequential element in the livelock, wherein the sequential element initially toggles, but eventually sticks to a constant value (either 0 or 1).

Livelocks and toggle deadlocks are important design properties to verify in a hardware design. To check whether a livelock or a toggle deadlock exists in a design, ideally the checking should be performed on the whole design. However, the large size and high complexity of real designs have made it impractical to check the whole design. While some conventional techniques can handle up to a few hundred sequential elements, real designs often contain hundreds of thousands of sequential elements.

Hence, what is needed are a method and a system for performing livelock/deadlock checking on real designs without the above-described problems.

SUMMARY

Some embodiments of the present invention provide systems and techniques for checking a livelock in a circuit design, wherein a livelock is a set of states in the circuit design wherein no path is going from the set of states to any other state that is reachable from an initial state of the circuit design.

During operation, the system can identify a finite state machine (FSM) in the circuit design, wherein the FSM comprises a first set of state variables corresponding to a first set of sequential elements. The system can then construct an abstract machine of the circuit design, wherein the abstract machine includes the FSM and a second set of state variables corresponding to a second set of sequential elements, wherein the second set of sequential elements drive the first set of sequential elements. Next, the system can search for one or more livelocks in the abstract machine. If a livelock is found in the abstract machine, the system can verify that the livelock is a livelock in a concrete machine of the circuit design, wherein the concrete machine includes the FSM and a third set of state variables corresponding to a third set of sequential elements, wherein the second set of state variables is a subset of the third set of state variables.

In some embodiments, the third set of state variables corresponds to a cone of influence (COI) of the FSM and the system can construct the abstract machine by identifying the second set of state variables from the COI of the FSM.

In some embodiments, to identify the second set of state variables from the COI of the FSM, the system can compute a degree of influence of each of the third set of sequential elements on the first set of sequential elements in the FSM. The system then identifies a subset of the third set of state variables which corresponds to a subset of the third set of sequential elements that has the highest degree of influence in the third set of sequential elements.

In some embodiments, to identify the second set of state variables from the COI of the FSM, the system can identify a second FSM within the COI of the FSM. The system then includes each state variable in the second FSM in the second set of state variables.

In some embodiments, to search for one or more livelocks in the abstract machine, the system first identifies an initial state in the abstract machine. Next, the system searches, in the abstract machine, for a strongly connected component (SCC) which is forward-reachable from the initial state, wherein an SCC is a set of states wherein there is at least one path from one state to any other state in the set of states. If the SCC is found, the system then determines whether the SCC is a terminal SCC (TSCC), wherein a TSCC is an SCC wherein there is no path from any state in the SCC to any state outside the SCC. If so, the system identifies the TSCC as a livelock in the abstract machine.

In some embodiments, to verify that the livelock in the abstract machine is a livelock in the concrete machine, the system can generate an abstract trace from an initial state in the abstract machine to a state in the livelock in the abstract machine. The system then attempts to concretize the abstract trace to obtain a corresponding concrete trace in the concrete machine. If the corresponding concrete trace can be obtained, the system subsequently determines that the livelock in the abstract machine is a livelock in the circuit design.

In some embodiments, the system can check a toggle deadlock in a circuit design. During operation, the system starts by searching for livelocks in the abstract machine of the circuit design. If a livelock is found in the abstract machine, the system then determines whether the livelock includes a toggle deadlock, wherein a toggle deadlock is a state of a state variable in the livelock, wherein the state variable initially toggles, but eventually sticks to a constant value. If the livelock includes a toggle deadlock, the system next verifies that the toggle deadlock in the abstract machine is a toggle deadlock in the concrete machine of the circuit design.

In some embodiments, to verify that the toggle deadlock in the abstract machine is a toggle deadlock in the concrete machine of the circuit design, the system can also generate an abstract trace from an initial state in the abstract machine to a state in the livelock that contains the toggle deadlock. The system then attempts to concretize the abstract trace to obtain a corresponding concrete trace in the concrete machine. If the corresponding concrete trace can be obtained, the system subsequently determines that the toggle deadlock in the abstract machine is a toggle deadlock in the circuit design.

DETAILED DESCRIPTION

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present invention is not limited to the embodiments shown, but is to be accorded the widest scope consistent with the principles and features disclosed herein.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing code and/or data now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, methods and processes described herein can be included in hardware modules or apparatus. These modules or apparatus may include, but are not limited to, an application-specific integrated circuit (ASIC) chip, a field-programmable gate array (FPGA), a dedicated or shared processor that executes a particular software module or a piece of code at a particular time, and/or other programmable-logic devices now known or later developed. When the hardware modules or apparatus are activated, they perform the methods and processes included within them.

Figure 1:
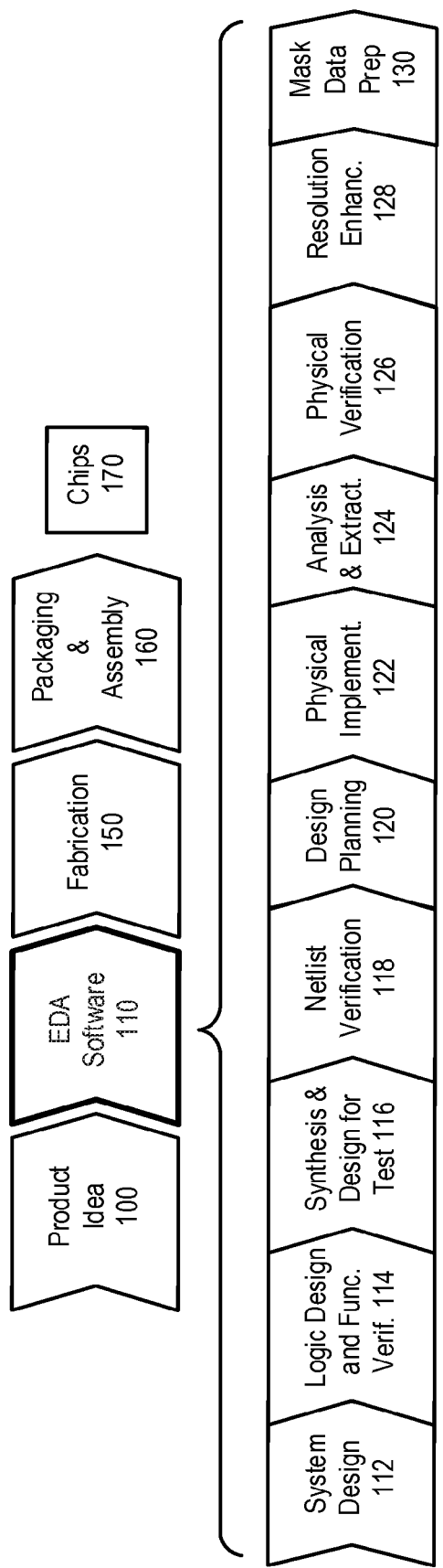
FIG. 1 illustrates various steps in the design and fabrication of an integrated circuit.

FIG. 1 illustrates various steps in the design and fabrication of an integrated circuit. The process typically starts with a product idea 100, which is realized using Electronic Design Automation (EDA) software 110. Chips 170 can then be produced from the finalized design by performing fabrication 150 and packaging and assembly 160.

A design flow that uses EDA software 110 is described below. Note that the design flow description is for illustration purposes only, and is not intended to limit the present invention. For example, an actual integrated circuit design may require a designer to perform the design flow steps in a different sequence than the sequence described below.

In the system design step 112, the designers can describe the functionality to implement. They can also perform what-if planning to refine the functionality and to check costs. Further, hardware-software architecture partitioning can occur at this step. In the logic design and functional verification step 114, a Hardware Description Language (HDL) design can be created and checked for functional accuracy.

In the synthesis and design step 116, the HDL code can be translated to a netlist, which can be optimized for the target technology. Further, tests can be designed and implemented to check the finished chips. In the netlist verification step 118, the netlist can be checked for compliance with timing constraints and for correspondence with the HDL code.

In the design planning step 120, an overall floor plan for the chip can be constructed and analyzed for timing and top-level routing. Next, placement and routing can be performed in the physical implementation step 122.

In the analysis and extraction step 124, the circuit functionality can be verified at a transistor level. In the physical verification step 126, the design can be checked to correct any functional, manufacturing, electrical, or lithographic issues.

In the resolution enhancement step 128, geometric manipulations can be performed on the layout to improve manufacturability of the design. Finally, in the mask data preparation step 130, the design can be taped-out for production of masks to produce finished chips.

Embodiments of the present invention can be used during one or more of the above-described stages. Specifically, in some embodiments the present invention can be used during logic design and functional verification step 114.

DEFINITIONS OF TERMS

Throughout the specification, the following terms have the meanings provided herein, unless the context clearly dictates otherwise.

Circuit design: a circuit design refers to a logic design of an integrated circuit (IC). The terms "circuit design" and "design" are used interchangeably throughout.

State variable: the output of a sequential logic element (or a "sequential element"), such as a latch in a design, is represented by a state variable in an abstraction of the design.

Livelock: a livelock is a set of states in a design wherein no path is going from the set of states to any other state that is reachable from an initial state of the design.

Deadlock: a deadlock is a special case of a livelock when the number of states in the livelock is one.

Toggle deadlock: a toggle deadlock is a state of a sequential element in a livelock, wherein a state variable corresponding to the sequential element initially toggles, but eventually sticks to a constant value.

Concrete machine: a concrete machine is an abstraction of a design. Typically, a concrete machine of a design comprises a finite state machine (FSM) and all the state variables in the cone of influence (COI) of the FSM.

Abstract machine: an abstract machine is an abstraction of a design. Typically, an abstract machine of a design comprises an FSM and a subset of state variables in the COI of the FSM. Hence, a minimal abstract machine becomes the FSM itself, and a maximal abstract machine becomes the concrete machine.

FSM state: a state defined in terms of the state variables in the FSM.

Abstract state: a state defined in terms of a set of state variables in the abstract machine.

Concrete state: a state defined in terms of a set of state variables in the concrete machine.

Overview

Embodiments of this disclosure provide a method and system for checking livelocks in a design. In a particular embodiment, the system constructs an abstract machine for the design. The system may also construct a concrete machine for the design. The system then searches for one or more livelocks in the abstract machine of the design. Because the abstract machine representation of the design can be significantly smaller than the concrete machine representation of the design, the system reduces the complexity of checking livelocks in the abstract machine of the design. If a livelock is found in the abstract machine, the system then verifies that this livelock is also a livelock in the concrete machine of the design. If so, the system determines that the livelock found in the abstract machine is a real livelock in the whole design.

In some embodiments, if a livelock is found in the abstract machine, the system additionally determines if the livelock includes a toggle deadlock. If so, the system further verifies that the toggle deadlock in the abstract machine is a toggle deadlock in the concrete machine. If so, the system determines that the toggle deadlock in the abstract machine is a real toggle deadlock in the design.

Constructing an Abstract Machine

Ideally, checking livelocks in a design is performed on the entire design. However, this approach is often impractical because of the typically large sizes of real designs. One technique that may reduce the computational complexity involves checking livelocks with respect to one or more finite state machines (FSMs) in the design. When checking livelocks based on an FSM, the entire cone of influence (COI) logic (or the "COI") of the FSM should be included in the checking process to ensure that the result is accurate. However, the COI of an FSM can include the entire design, thereby making this approach still extremely computationally intensive for most of the real designs.

One embodiment of the present invention performs livelock checking on an abstracted COI of an FSM by constructing an abstract machine of the design. Furthermore, once a livelock is found in the abstract machine, the result is verified in the full COI of the FSM, i.e., the concrete machine of the design.

Figure 2:
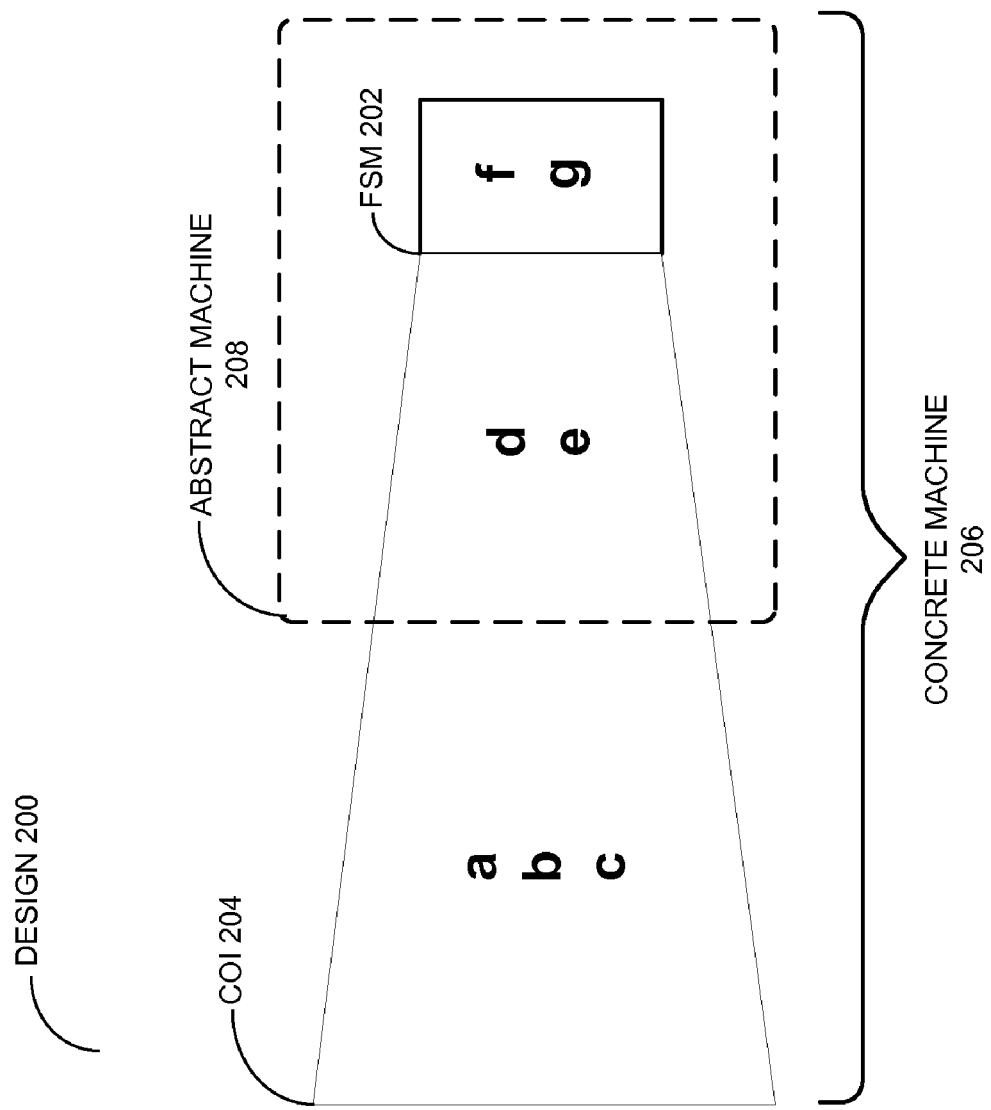
FIG. 2 illustrates an exemplary process of constructing an abstract machine for a design in accordance with some embodiments of the present invention.

FIG. 2 illustrates an exemplary process of constructing an abstract machine for a design 200 in accordance with some embodiments of the present invention. In the example shown in FIG. 2, an FSM 202 contains two state variables {f, g}. In one embodiment, FSM 202 is automatically extracted from a high-level model (e.g., a register-transfer-level (RTL) model) of design 200. Note that multiple FSMs may be extracted from the same design, and each of the multiple FSMs may be independently processed. In another embodiment, FSM 202 is specified by a user based on design objectives.

Note that when automatic FSM extraction is used to obtain a target FSM, different extraction tools/techniques can generate different sets of FSMs from a given design. Among these different sets of FSMs, some FSMs may be "agreed" upon by all extraction tools/techniques, whereas some other FSMs are not "agree" upon by all the extraction tools/techniques. Hence, in one embodiment, only those FSMs that are identified by multiple extraction tools/techniques are used as target FSMs for constructing an abstract machine. In one embodiment, if a user determines that an intended FSM is missing from the automatic extraction results, a user may specify a target FSM with any set of sequential elements in the design. In a further embodiment, a user can build a target FSM by combining multiple extracted FSMs. Consequently, a target FSM may be identified by combining the techniques of automatic extraction and user-specification.

Also illustrated in FIG. 2 is a COI 204 of FSM 202, which contains five state variables {a, b, c, d, e}. Note that the COI of an FSM can be determined using any conventional technique. For example, the COI of FSM 202 can include all state variables in design 200 which have effects on the values of state variables {f, g}. Note that FSM 202 and COI 204 form a concrete machine 206 of design 200.

In the present disclosure, a state variable in a concrete machine may be used to represent an output of a sequential element in the FSM or the COI of the concrete machine. For example, the two state variables {f, g} in FSM 202 correspond to the outputs of two sequential elements in FSM 202, while the five state variables {a, b, c, d, e} in COI 204 correspond to the outputs of five sequential elements in COI 204.

In one embodiment, an abstract machine for design 200 includes FSM 202 and a set of influential sequential elements that drives the set of sequential elements in FSM 202. Note that each of the set of influential latches is also one of the sequential elements within COI 204. However, not all of the sequential elements within COI 204 may be included in the abstract machine. In one embodiment, the set of influential latches is a subset of the sequential elements in COI 204. For example, in the embodiment of FIG. 2, an abstract machine 208 includes FSM 202 and two state variables {d, e} which are a subset of COI 204. In this embodiment, sequential elements corresponding to state variables {f, g} in FSM 202 may be directly driven by latches corresponding to state variables {d, e} but not by sequential elements corresponding to state variables {a, b, c}. In one embodiment, while one or more of sequential elements corresponding to state variables {d, e} may be directly driven by one or more of sequential elements corresponding to state variables {a, b, c}, none of sequential elements corresponding to state variables {a, b, c} may be directly driven by one or more of sequential elements corresponding to state variables {d, e}. Note that because abstract machine 208 includes only those sequential elements that directly drive FSM 202, the size of abstract machine 208 is significantly reduced from the size of concrete machine 206.

In one embodiment, an abstract machine for the design includes "N-most influential latches of a target FSM," wherein N is a predefined number or a user-defined number. In one embodiment, N is significantly smaller than the number of sequential elements in the design. Note that a technique for deciding the N-most influential latches of the target FSM may be a heuristic. In one embodiment, the heuristic involves first determining whether there are one or more FSMs in the COI of the target FSM. If such an FSM is found in the COI, the latches in the FSM are given higher priority for inclusion in the N-most influential latches of the target FSM.

In another embodiment, to determine the N-most influential latches of a target FSM, the system first computes a degree of influence for each sequential element in the COI of the target FSM. The system then identifies a subset of sequential elements in the COI which have the highest degrees of influence for inclusion in the N-most influential latches of the target FSM. Note that the N-most influential latches typically are of the highest interest to a designer. In the embodiment of FIG. 2, abstract machine 208 comprises N=2 most influential latches of FSM 202.

Process for Checking a Livelock in a Design

Figure 3:
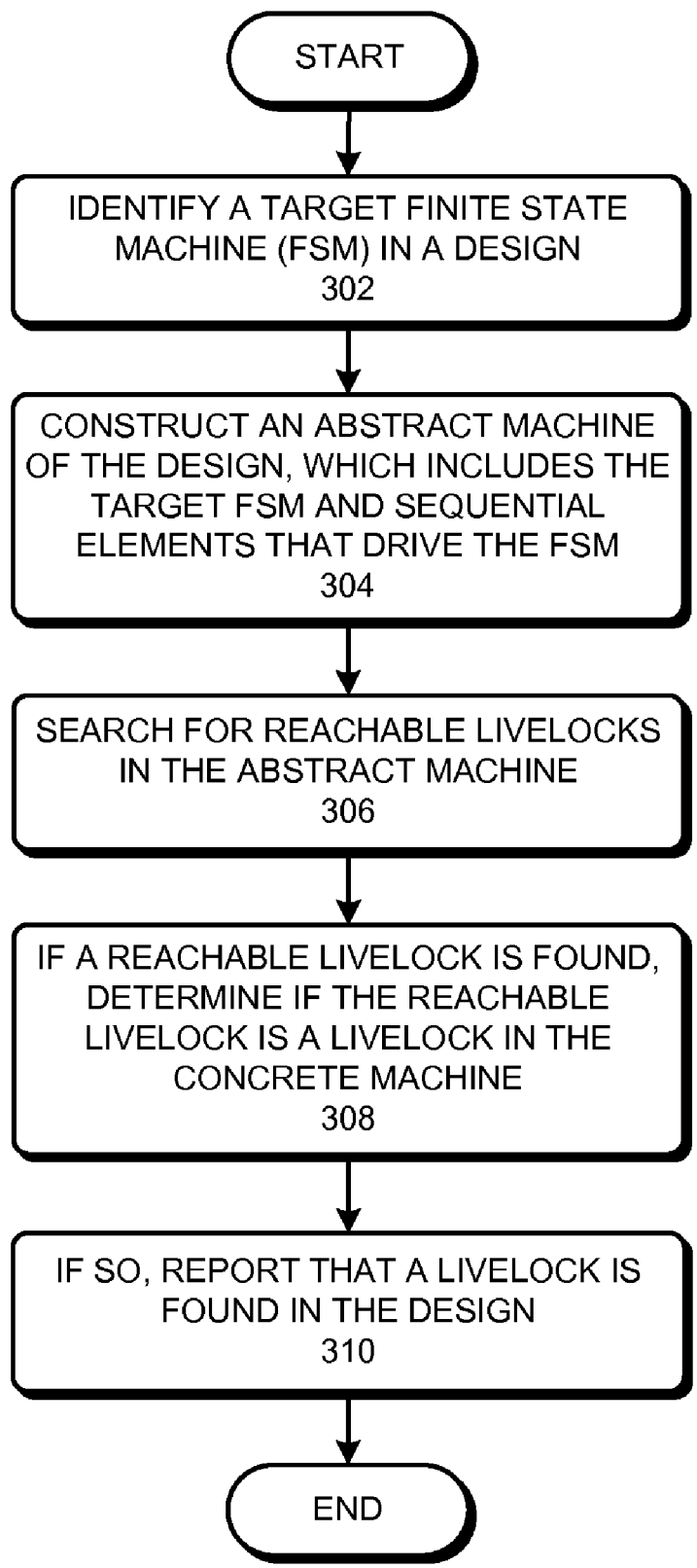
FIG. 3 presents a flowchart illustrating a process of checking livelocks in a design in accordance with some embodiments of the present invention.

FIG. 3 presents a flowchart illustrating a process of checking livelocks in a design in accordance with some embodiments of the present invention.

During operation, the system identifies a target FSM in the design, (step 302). Note that the target FSM can be either automatically extracted or user-specified. In one embodiment, the target FSM is identified by combining the techniques of automatic extraction and user-specification. The system then constructs an abstract machine of the design, wherein the abstract machine includes the target FSM and a set of sequential elements that drive the sequential elements in the FSM (step 304). Note that the system can use the techniques described in conjunction with FIG. 2 to construct the abstract machine in this step. Next, the system searches for reachable livelocks in the abstract machine (step 306). A more detailed embodiment of step 306 is provided below.

Figure 4:
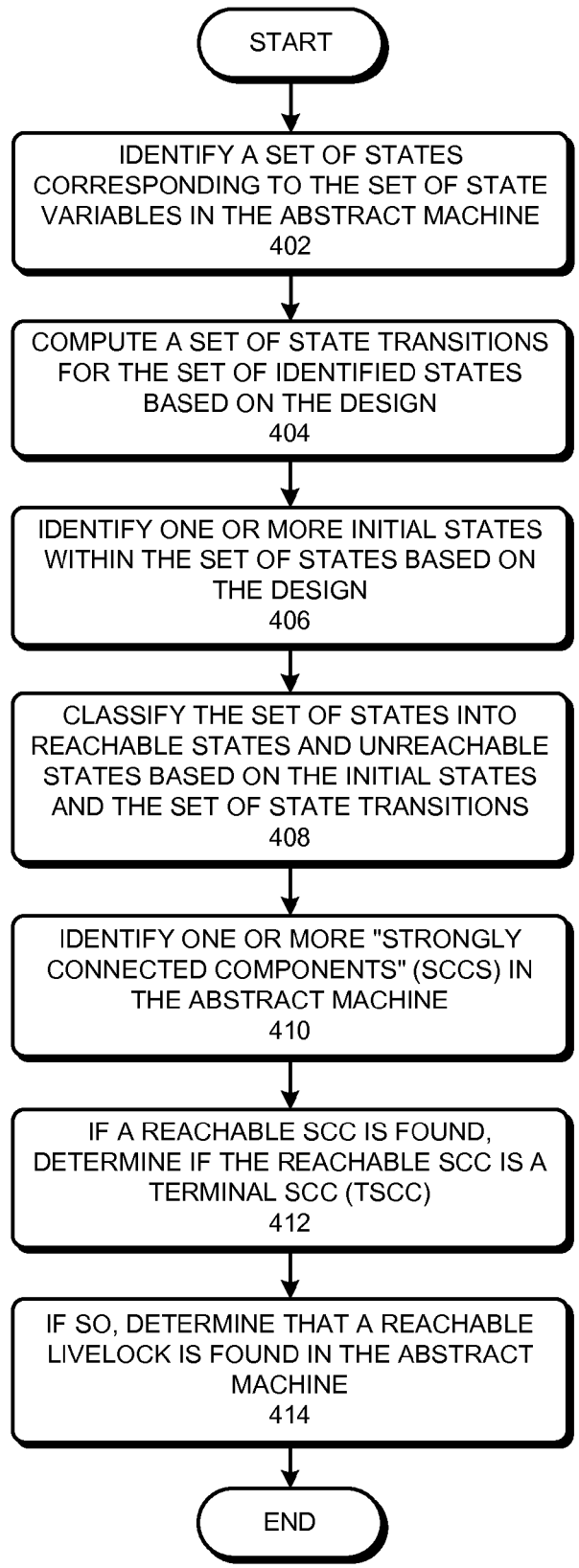
FIG. 4 presents a flowchart illustrating a process of searching for reachable livelocks in an abstract machine of a design in accordance with some embodiments of the present invention.

FIG. 4 presents a flowchart illustrating a process of searching for reachable livelocks in an abstract machine of a design in accordance with some embodiments of the present invention.

During operation, the system identifies a set of states corresponding to the set of state variables in the abstract machine (step 402). The system then computes a set of state transitions for the set of identified states based on the design (step 404). The system additionally identifies one or more initial states within the set of states based on the design (step 406).

Next, the system classifies the set of states into reachable states and unreachable states based on the initial states and the set of state transitions (step 408). In one embodiment, the system determines a state as a reachable state if that state is forward-reachable from an initial state in accordance with the set of state transitions. Similarly, the system determines a state as an unreachable state if that state is not forward-reachable from any initial state in accordance with the set of state transitions. In one embodiment, the unreachable states in the abstract machine are excluded from the search for the livelocks.

Figure 5:
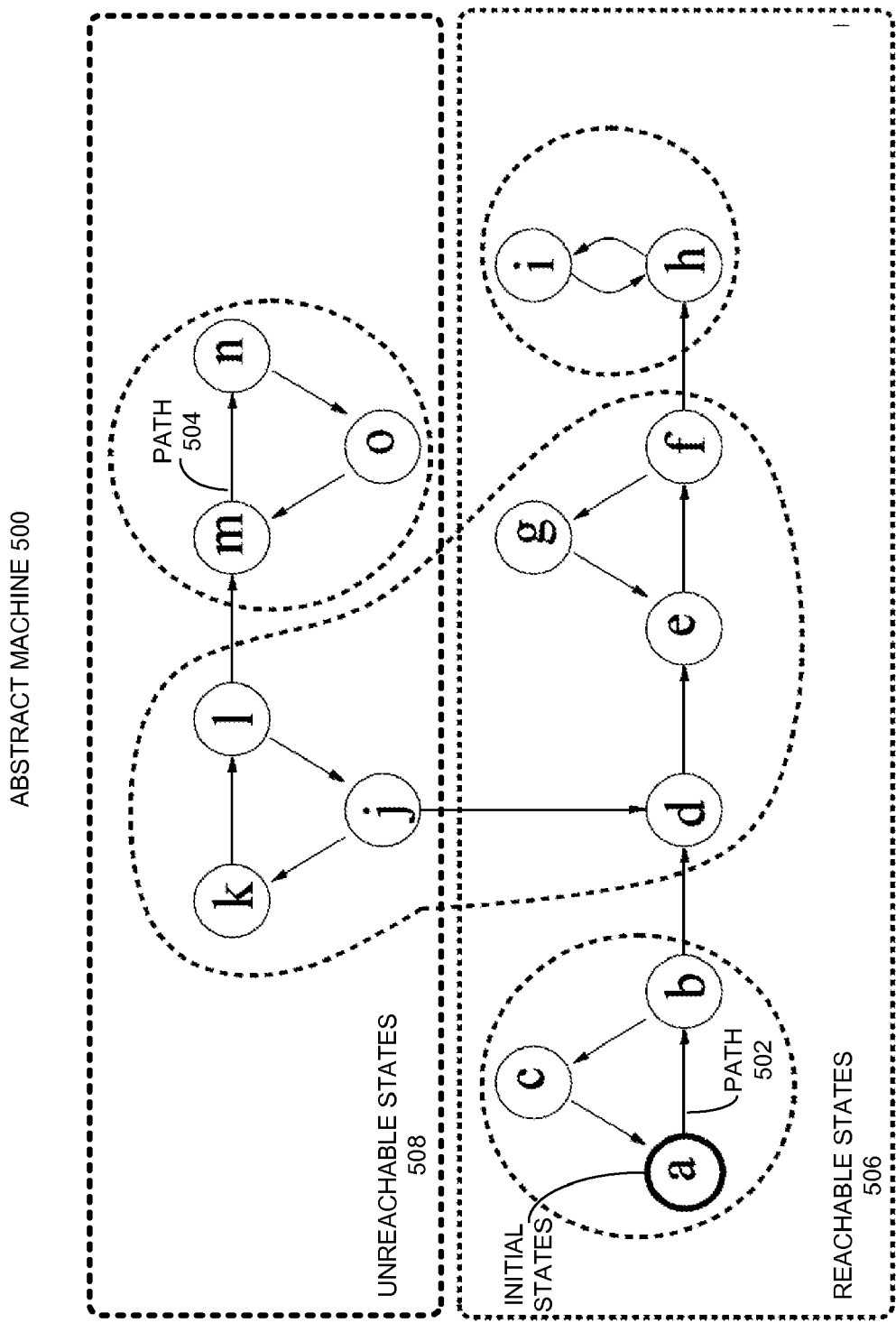
FIG. 5 illustrates an exemplary abstract machine and a set of state transitions in the abstract machine in accordance with some embodiments of the present invention.

FIG. 5 illustrates an exemplary abstract machine 500 and a set of state transitions in abstract machine 500 in accordance with some embodiments of the present invention. As illustrated in FIG. 5, abstract machine 500 comprises a set of 15 states {a, b, c, . . . , o}. The set of states are interconnected by a set of state transitions illustrated as a set of unidirectional paths, for example, a path 502 indicates a transition from state a to state b, and a path 504 indicates a transition from state m to state n. In one embodiment, state a is the only initial state in abstract machine 500. As a result, the set of states can be classified into a set of reachable states 506 which includes states a to i, and a set of unreachable states 508 which includes states j to o.

Returning to FIG. 4, after classifying the set of states in the abstract machine into reachable and unreachable states, the system then identifies one or more "strongly connected components" (SCCs) in the abstract machine, wherein an SCC is a set of states wherein there is always a path from one state to any other state in the set of states (step 410). For example, there are a number of SCCs in FIG. 5, such as {a, b, c}, {e, f, g}, {j, k, l}, {m, n, o}, and {h, i}. We may classify these SCCs into reachable SCCs, i.e., {a, b, c}, {e, f, g}, and {h, i}, and unreachable SCCs, i.e., {j, k, l} and {m, n, o} based on the reachable/unreachable state classification.

If a reachable SCC is found, the system then determines if the reachable SCC is a terminal SCC (TSCC), wherein a TSCC is an SCC wherein there are only incoming edges to the SCC but no outgoing edges from the SCC to any state outside the SCC (step 412). In the example of FIG. 5, there are two TSCCs, {h, i} and {m, n, o}, wherein {h, i} is a reachable TSCC while {m, n, o} is an unreachable TSCC. Based on the definition of a livelock, a reachable TSCC (e.g., the SCC {h, i} in FIG. 5) becomes a reachable livelock in the abstract machine (step 414).

State Classification with an Initial State

In one embodiment, the set of states in the abstract machine can be further classified into a main group, a transient group, and one or more livelock groups. More specifically, the main group is an SCC that includes the initial state. A livelock group is a TSCC, i.e., a "livelock." The remaining states in the abstract machine are classified into the transient group. A livelock group is further classified into either a reachable livelock group or an unreachable livelock group from the initial state.

For example, in the embodiment of FIG. 5, because state a is the initial state, SCC {a, b, c} becomes the main group. There are two TSCCs, {h, i} and {m, n, o}, wherein {h, i} is a reachable livelock group and {m, n, o} is an unreachable livelock group. The remaining states {d, e, f, g, j, k, l} belong to the transient group. In the discussion below, we refer to a reachable livelock group simply as a "livelock."

Handling Multiple Initial States

Figure 6:
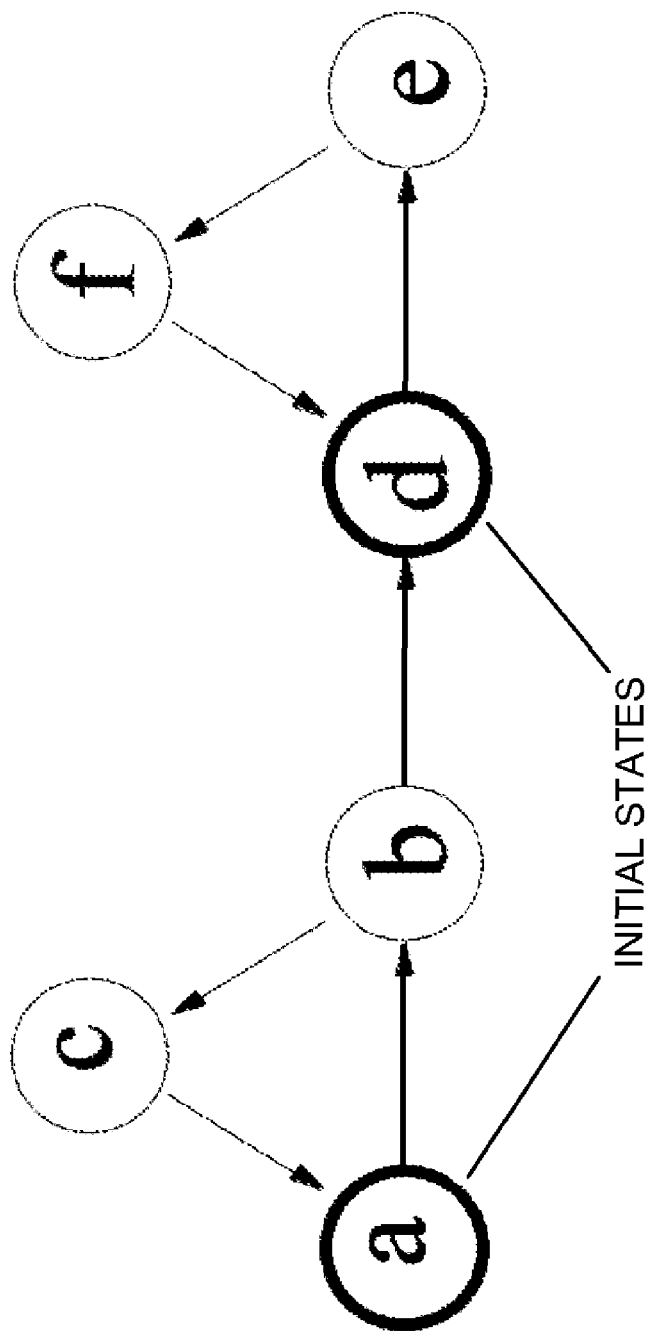
FIG. 6 illustrates a state transition graph of a set of states of an abstract machine which has two initial states in accordance with some embodiments of the present invention.

When there is only one initial state in the set of states of an abstract machine (such as in FIG. 5), the TSCCs are identified within the reachable states from the single initial state. However, in practice, there can be multiple initial states within a given abstract machine. For example, FIG. 6 illustrates a state transition graph of a set of states a to f of an abstract machine 600 which has two initial states {a, d} in accordance with some embodiments of the present invention.

In this example, if state a is selected as the only initial state for livelock checking, we identify a livelock {d, e, f}. On the other hand, is state d is selected as the only initial state, no livelock will be found. However, if both states a and d are selected as the initial states at the same time, and forward- and backward-reachability searches are performed from the two initial states, livelock {d, e, f} cannot be found. This suggests that, in the case of multiple initial states, livelock checking should be separately performed on each of the multiple initial states.

However, the actual number of livelock searches is typically fewer than the number of initial states. We now consider the following two scenarios.

- Only one initial state is needed from an SCC. Referring to FIG. 6, assume that there are three initial states {a, b, c}. Note that, after performing livelock checking using any one of {a, b, c}, there is no need to repeat the check using the other initial states. For example, if we check livelock with initial state a, we don't need to check with initial states b and c. This is because the result is the same no matter which of the three initial states is used.
- Once livelock checking is performed for a given initial state, any other initial states that are forward-reachable from that initial state can be skipped. In the example of FIG. 6 with the initial states {a, d}, if livelock checking is first performed on the initial state a, there is no need to repeat the check using state d because state d is a reachable state from state a.

Consequently, many of the multiple initial states can be eliminated from consideration while only one or a few initial states are actually used.

While the above discussion provides detailed embodiments of the process of identifying reachable livelocks in an abstract machine, a livelock identified in the abstract machine is only a potential livelock in the corresponding concrete machine. We now return to FIG. 3 to continue the process of searching for a livelock in the whole design.

If a reachable livelock is found in the abstract machine during step 306, the system next determines whether the reachable livelock in the abstract machine is a livelock in the corresponding concrete machine (step 308). Recall that the concrete machine is the target FSM and the entire COI of the FSM. While a livelock is reachable from the initial state in the abstract machine, it is necessary to verify that the livelock is also reachable within the corresponding concrete machine.

Figure 7:
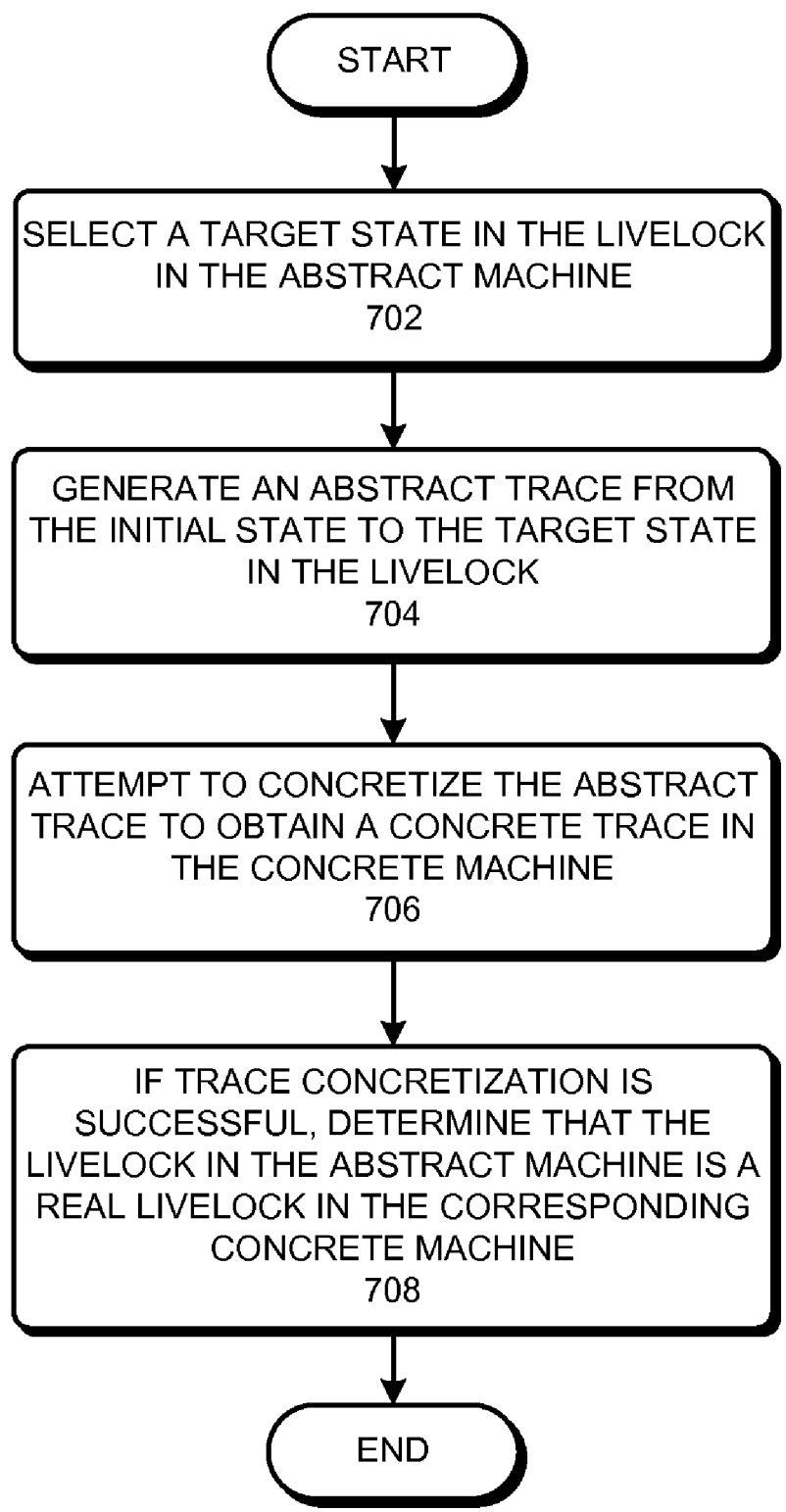
FIG. 7 presents a flowchart illustrating a process of verifying that a livelock in an abstract machine is a livelock in the corresponding concrete machine in accordance with some embodiments of the present invention.

FIG. 7 presents a flowchart illustrating a process of verifying that a livelock in an abstract machine is a livelock in the corresponding concrete machine in accordance with some embodiments of the present invention. During operation, the system starts by selecting a target state in the livelock in the abstract machine (step 702). In one embodiment, the target state is the state in the livelock that is closest to the initial state that is used to identify the livelock. In another embodiment, the target state can be any state in the livelock.

The system then generates an abstract trace from the initial state to the target state in the livelock (step 704). In one embodiment, the system starts from the target state and generates the abstract trace by iteratively performing pre-image computation on each state from the target state until the initial state is reached. In this embodiment, the values of the input variables are preserved during the pre-image computations. Note that a pre-image computation typically computes all states that can reach a given state in one step. In one embodiment, if there are multiple initial states in the abstract machine, the initial state in step 704 is the initial state which is used to identify the livelock. Note that any other technique which can be used to generate the abstract trace may be used in step 704.

Next, the system attempts to concretize the abstract trace to obtain a concrete trace in the concrete machine (step 706). In one embodiment, a concrete trace is obtained in the concrete machine based on the abstract trace. The following process describes a technique for obtaining the concrete trace. However, other techniques which can perform trace concretization may be used in step 706.

Assume that the abstract trace is $\{A_0, A_1, \ldots, A_n\}$ wherein $A_0$ is the initial state in the abstract machine. For each transition from $A_{i-1}$ to $A_i$ (starting with i=1) on the concrete machine, we build a bounded model checking (BMC) problem such that the target state is $A_i$ and the initial state is the last concrete state computed from the previous iteration when the target state is $A_{i-1}$. The concrete initial state is used as the initial state in the very first iteration with i=1. We can first try to solve the BMC problem by using a satisfiability (SAT) solver with resource limits. However, if the BMC problem cannot be solved by the SAT solver, a simulation may be performed until the target state is reached.

Returning to FIG. 7, if the trace concretization process in step 706 is successful, the system determines that the livelock in the abstract machine is a real livelock in the corresponding concrete machine (step 708). However, if the trace concretization process fails, the system cannot draw any conclusion regarding the identified livelock in the abstract machine.

We now return to FIG. 3 a final time. If the reachable livelock in the abstract machine is a livelock in the concrete machine, the system reports that a livelock is found in the design (step 310). On the other hand, if no livelock is found in the abstract machine during step 306 (i.e., no TSCC is found), it is not proof of there being no livelock in the corresponding concrete machine and the design, unless the abstract machine has included the entire concrete machine. However, the result of "no livelock in the abstract machine" provides a higher level of confidence that no livelock exists in the design.

In some embodiments, the system can extract a plurality of FSMs from a given design and subsequently construct a plurality of abstract machines such that each of the plurality of abstract machines corresponds to a respective FSM in the plurality of FSMs. Hence, the above-described techniques for checking livelocks can be applied to each of the plurality of abstract machines.

Process for Checking a Toggle Deadlock in a Design

While a livelock may occur on a set of states within a design, a toggle deadlock may occur on a state variable. A state variable is considered to have a toggle deadlock if the state variable initially toggles, but eventually becomes stuck at a constant value.

Figure 8:
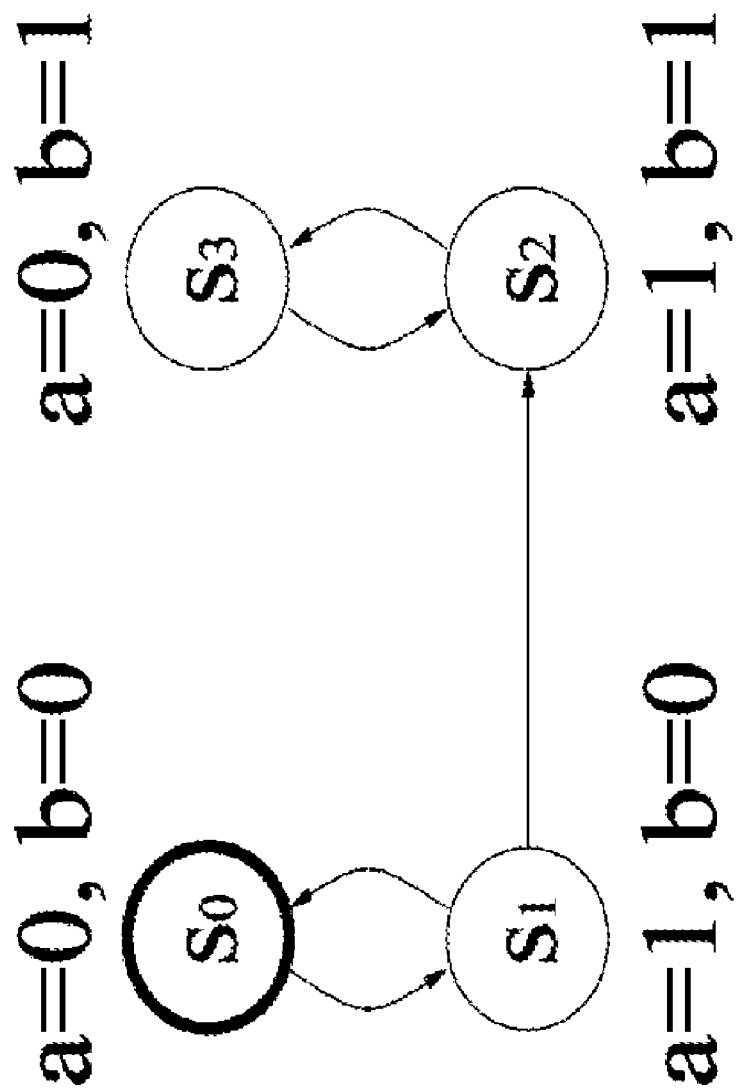
FIG. 8 illustrates a toggle deadlock condition in an exemplary design in accordance with some embodiments of the present invention.

FIG. 8 illustrates a toggle deadlock condition in an exemplary design in accordance with some embodiments of the present invention. As illustrated in FIG. 8, there are two state variables {a, b} in the design, which results in four states $\{s_0, s_1, s_2, s_3\}$ of the design. Assume that $s_0$ is the initial state, then $\{s_0, s_1\}$ is the main group and $\{s_2, s_3\}$ is the livelock group. Once the state transition reaches state $s_2$, which is a state in the livelock group, the value of state variable b gets stuck at 1, whereas state variable a continues to toggle. As a result, state variable b is identified as a toggle deadlock in the exemplary design.

Figure 9:
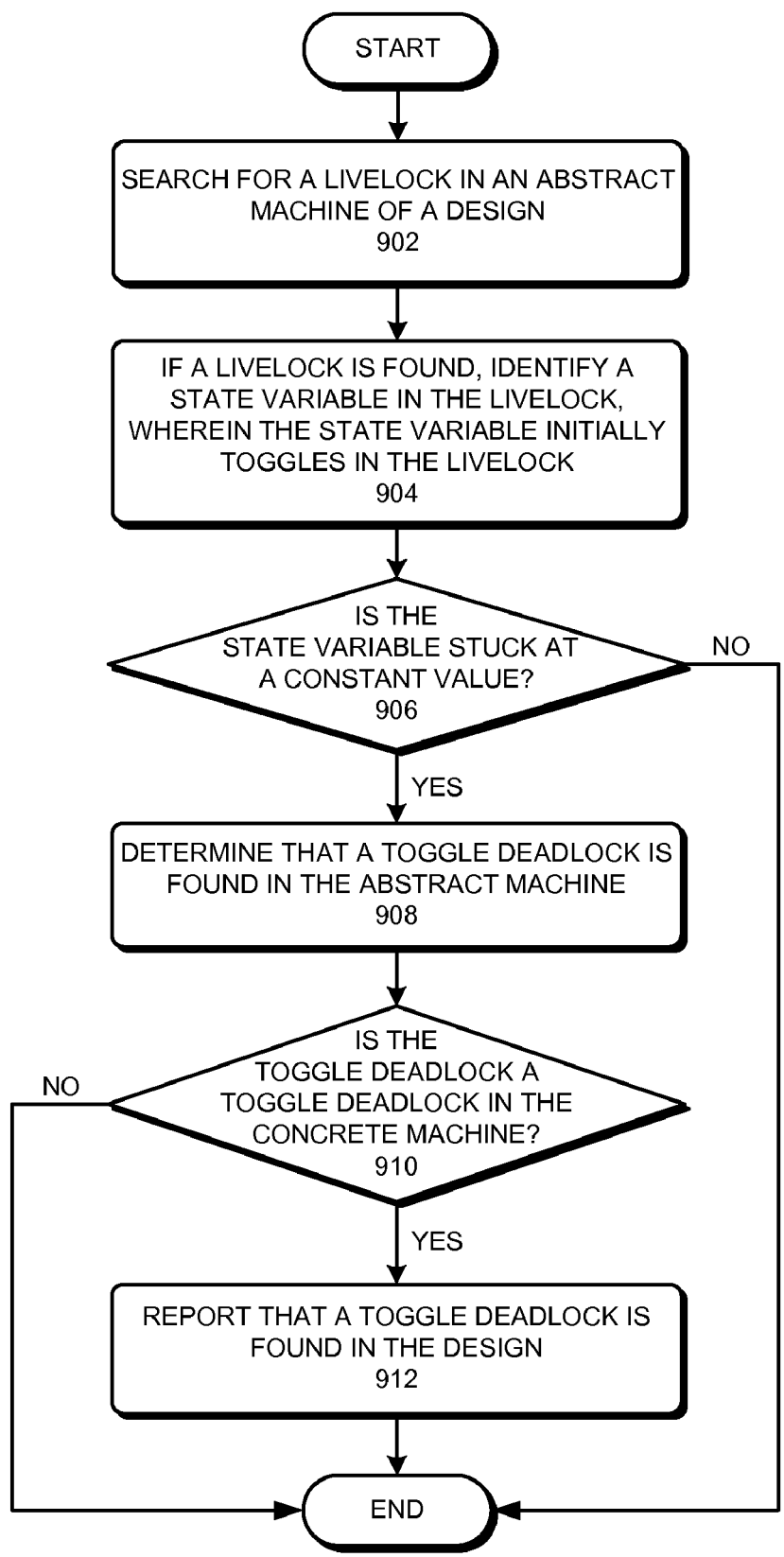
FIG. 9 presents a flowchart illustrating a process of checking a toggle deadlock in a design in accordance with some embodiments of the present invention.

FIG. 9 presents a flowchart illustrating a process of checking a toggle deadlock in a design in accordance with some embodiments of the present invention.

In one embodiment, the process of checking a toggle deadlock uses substantially the same steps 302-306 described in conjunction with FIG. 3 to search for a livelock in an abstract machine of the design. However, if a reachable livelock is found in the abstract machine, the process of checking the toggle deadlock deviates from FIG. 3. Hence, during operation, the system starts by searching for a livelock in an abstract machine of the design (step 902), which is equivalent to steps 302-306 in FIG. 3. Consequently, all described techniques with respect to steps 302-306 may be used during step 902.

If a livelock is found in the abstract machine during step 902, the system then identifies a state variable in the livelock, wherein the state variable initially toggles in the livelock (step 904). The system then determines if the state variable gets stuck at a constant value (step 906). If so, the system determines that a toggle deadlock is found in the abstract machine (step 908) and proceeds to determine whether the toggle deadlock is a toggle deadlock in the corresponding concrete machine (step 910).

In one embodiment, the system uses substantially the same steps as described in conjunction with FIG. 7 during step 908. More specifically, the system computes an abstract trace from an initial state to a target state in the livelock that contains the potential toggle deadlock and then attempts to concretize the abstract trace to obtain a concrete trace in the concrete machine. Note that all described techniques with respect to steps 702-706 may be used during step 908.

If the trace concretization process in step 910 is successful, the system determines that the toggle deadlock in the abstract machine is also a toggle deadlock in the corresponding concrete machine and subsequently reports that a toggle deadlock is found in the design (step 912). However, if the trace concretization process in step 910 fails, the system cannot draw any conclusion regarding the identified toggle deadlock in the abstract machine.

Note that, if the determination step 906 returns negative, that is, the state variable continues to toggle, the system cannot draw any conclusion regarding the identified livelock in the abstract machine. Moreover, if no livelock is found in the abstract machine during step 902 (i.e., no TSCC is found), it is not proof of there being no toggle deadlock in the corresponding concrete machine, unless the abstract machine has included the entire concrete machine. However, the result of "no livelock in the abstract machine" provides a higher level of confidence that no toggle deadlock exists on the state variables in the design.

Causality Checking

Note that, while the above-described techniques perform livelock/deadlock checking on an abstract machine comprising an FSM and a subset of the COI of the FSM (and the livelock is reported with respect to the FSM states), it may be necessary to determine whether the FSM state variables contribute to an identified livelock. The following process describes a technique for determining whether the FSM state variables contribute to the livelock. However, other techniques which can perform the same function may also be used.

Let R be the set of reachable states in the abstract machine and L be the set of states in the livelock. Additionally, let F be the set of variables in the FSM and C be the set of variables in the COI of the FSM. Then, we define quantified R: $R_F$, and quantified L: $L_F$ as the following:

$$R_F = \exists c R(F,C);$$

$$L_F = \exists c L(F,C).$$

Consequently, if the following condition is true for the FSM, the FSM state variables contribute to the livelock:

$$L_F \subset R_F (L_F \neq R_F).$$

Apparatus and Computer System

Figure 10:
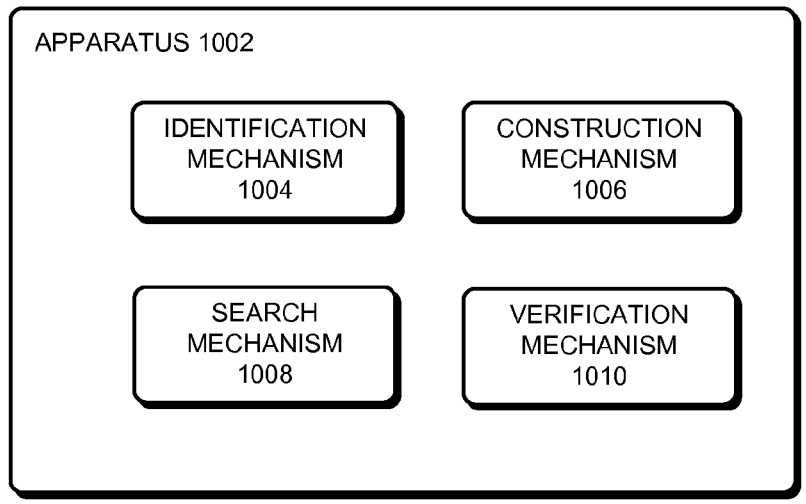
FIG. 10 illustrates an apparatus in accordance with some embodiments of the present invention.

FIG. 10 illustrates an apparatus in accordance with some embodiments of the present invention.

Apparatus 1002 can comprise mechanisms which communicate with one another via a wired or wireless communication channel. Apparatus 1002 may be realized using one or more integrated circuits, and apparatus 1002 may include fewer or more mechanisms than those shown in FIG. 10. Further, apparatus 1002 may be integrated in a computer system, or it may be realized as a separate device which is capable of communicating with other computer systems and/or devices.

Apparatus 1002 can include one or more mechanisms which are configured to perform processes which are inherently or explicitly described in this disclosure. Specifically, apparatus 1002 can comprise identification mechanism 1004, construction mechanism 1006, search mechanism 1008, and verification mechanism 1010. Each mechanism may be realized using one or more integrated circuits or as a module of a general purpose processor. Identification mechanism 1004 may be configured to identify an FSM in a design; construction mechanism 1006 may be configured to construct an abstract machine of the design; search mechanism 1008 may be configured to search for one or more livelocks in the abstract machine; and verification mechanism 1010 may be configured to verify that an identified livelock in the abstract machine is a livelock in a concrete machine of the design.

Figure 11:
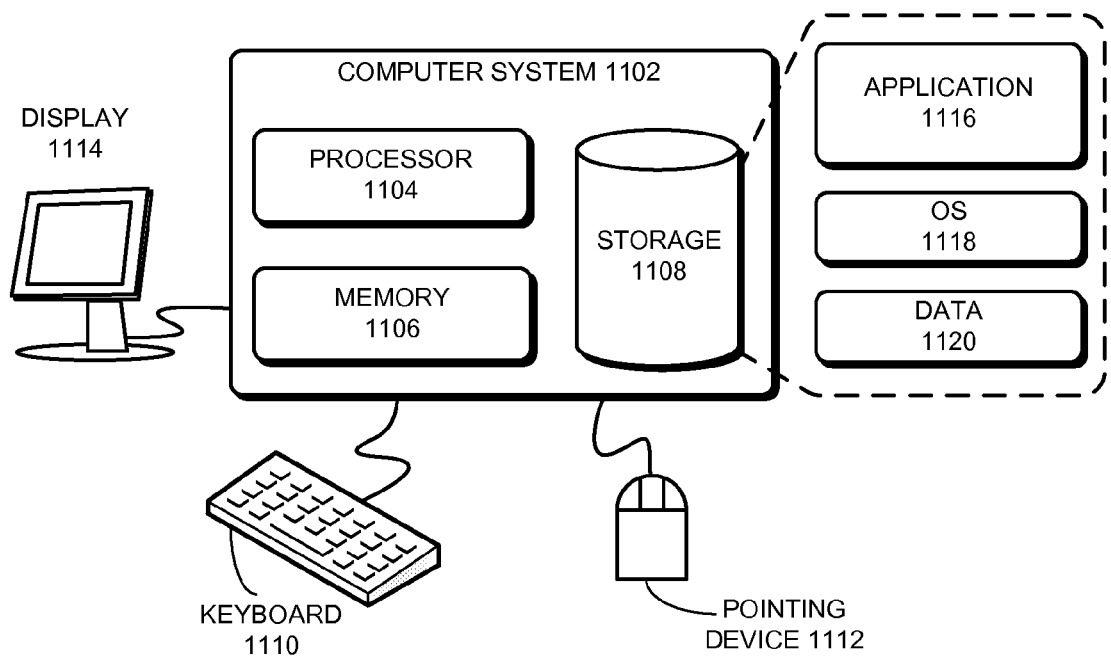
FIG. 11 illustrates a computer system in accordance with some embodiments of the present invention.

FIG. 11 illustrates a computer system in accordance with some embodiments of the present invention.

A computer or computer system can generally be any system that can perform computations. Specifically, a computer can be a microprocessor-based system which may include multiple processing cores, a network-processor-based system, a digital-signal-processor-based system, a portable computing device, a personal organizer, a distributed-computing-platform-based system, or any other computing system now known or later developed. Computer system 1102 comprises processor 1104, memory 1106, and storage 1108. Computer system 1102 can be coupled with display 1114, keyboard 1110, and pointing device 1112. Storage 1108 can generally be any device that can store data. In some embodiments, storage 1108 can include a non-transitory computer-readable storage medium. Specifically, a storage device can be a magnetic, an optical, or a magneto-optical storage device, or it can be based on flash memory and/or battery-backed up memory. Storage 1108 can store application 1116, operating system 1118, and data 1120.

Application 1116 can include instructions that when executed by computer 1102 cause computer 1102 to perform one or more processes which are inherently or explicitly described in this disclosure. Data 1120 can include any data that is required as input or that is generated as output by the methods and/or processes described in this disclosure The foregoing descriptions of various embodiments have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention.

What is claimed is:

1. A method for checking a livelock in a circuit design, wherein a livelock is a set of states in the circuit design that does not have any paths to a state outside the set of states that is reachable from an initial state of the circuit design, the method comprising:

identifying a finite state machine (FSM) in the circuit design, wherein the FSM comprises a first set of state variables corresponding to a first set of sequential elements;

constructing an abstract machine of the circuit design, wherein the abstract machine includes the FSM and a second set of state variables corresponding to a second set of sequential elements, wherein the second set of sequential elements drive the first set of sequential elements;

searching, by computer, for one or more livelocks in the abstract machine; and if a livelock is found in the abstract machine, verifying that the livelock is also present in a concrete machine of the circuit design, wherein the concrete machine includes the FSM and a third set of state variables corresponding to a third set of sequential elements, wherein the second set of state variables is a subset of the third set of state variables.

2. The method of claim 1, wherein the third set of state variables corresponds to a cone of influence (COI) of the FSM; and wherein constructing the abstract machine involves identifying the second set of state variables from the COI of the FSM.

3. The method of claim 2, wherein identifying the second set of state variables from the COI of the FSM involves:

computing a degree of influence of each of the third set of sequential elements on the first set of sequential elements in the FSM; and identifying a subset of the third set of state variables which corresponds to a subset of the third set of sequential elements that has the highest degree of influence in the third set of sequential elements.

4. The method of claim 2, wherein identifying the second set of state variables from the COI of the FSM involves:
identifying a second FSM within the COI of the FSM; and
including each state variable in the second FSM into the second set of state variables.

5. The method of claim 1, wherein searching for one or more livelocks in the abstract machine involves:
identifying an initial state in the abstract machine;
searching, in the abstract machine, for a strongly connected component (SCC) which is forward-reachable from the initial state, wherein an SCC is a set of states wherein there is at least one path from one state to any other state in the set of states;
if the SCC is found, determining whether the SCC is a terminal SCC (TSCC), wherein a TSCC is an SCC wherein there is no path from any state in the SCC to any state outside the SCC; and
if so, identifying the TSCC as a livelock in the abstract machine.

6. The method of claim 5, wherein searching for an SCC in the abstract machine further involves:
identifying a set of initial states in the abstract machine; and
if a first initial state in the set of initial states is forward-reachable from a second initial state in the set of initial states, eliminating the first initial state from the set of initial states so that the first initial state is not considered as an initial state when searching for the SCC.

7. The method of claim 5, wherein searching for an SCC in the abstract machine further involves:
identifying a set of initial states in the abstract machine; and
if the set of initial states includes a first SCC, using at most one state in the first SCC as the initial state when searching for a second SCC which is forward-reachable from the initial state.

8. The method of claim 1, wherein verifying that the livelock in the abstract machine is a livelock in the concrete machine involves:
generating an abstract trace from an initial state in the abstract machine to a state in the livelock in the abstract machine;
attempting to concretize the abstract trace to obtain a corresponding concrete trace in the concrete machine; and
if the corresponding concrete trace can be obtained, determining that the livelock in the abstract machine is a livelock in the circuit design.

9. The method of claim 1, wherein prior to verifying that the livelock in the abstract machine is a livelock in the concrete machine, the method further comprises identifying the COI of the FSM.

10. The method of claim 1, wherein if a livelock is found in the abstract machine, the method further comprises:
determining whether the livelock includes a toggle deadlock, wherein a toggle deadlock is a state of a state variable in the livelock, wherein the state variable initially toggles, but eventually sticks to a constant value; and
if so, verifying that the toggle deadlock in the abstract machine is a toggle deadlock in the concrete machine.

11. The method of claim 10, wherein verifying that the toggle deadlock in the abstract machine is a toggle deadlock in the concrete machine involves:
generating an abstract trace from an initial state in the abstract machine to a state in the livelock in the abstract machine;
attempting to concretize the abstract trace to obtain a corresponding concrete trace in the concrete machine; and
if the corresponding concrete trace is obtained, determining that the toggle deadlock in the abstract machine is a toggle deadlock in the circuit design.

12. The method of claim 1, wherein if a livelock is found in the abstract machine, the method further comprises determining whether the first set of state variables in the FSM contributes to the livelock.

13. The method of claim 1, wherein identifying a FSM in the circuit design involves using an automatic extraction tool to identify the FSM.

14. The method of claim 1, wherein identifying a FSM in the circuit design involves having a user to specify the FSM.

15. A non-transitory computer-readable storage medium storing instructions that when executed by a computer cause the computer to perform a method for checking a livelock in a circuit design, wherein a livelock is a set of states in the circuit design that does not have any paths to a state outside the set of states that is reachable from an initial state of the circuit design, the method comprising:
identifying a finite state machine (FSM) in the circuit design, wherein the FSM comprises a first set of state variables corresponding to a first set of sequential elements;
constructing an abstract machine of the circuit design, wherein the abstract machine includes the FSM and a second set of state variables corresponding to a second set of sequential elements, wherein the second set of sequential elements drive the first set of sequential elements;
searching for one or more livelocks in the abstract machine; and
if a livelock is found in the abstract machine, verifying that the livelock is also present in a concrete machine of the circuit design, wherein the concrete machine includes the FSM and a third set of state variables corresponding to a third set of sequential elements, wherein the second set of state variables is a subset of the third set of state variables.

16. The non-transitory computer-readable storage medium of claim 15,
wherein the third set of state variables corresponds to a cone of influence (COI) of the FSM; and
wherein constructing the abstract machine involves identifying the second set of state variables from the COI of the FSM.

17. The non-transitory computer-readable storage medium of claim 16, wherein identifying the second set of state variables from the COI of the FSM involves:
computing a degree of influence of each of the third set of sequential elements on the first set of sequential elements in the FSM; and
identifying a subset of the third set of state variables which corresponds to a subset of the third set of sequential elements that has the highest degree of influence in the third set of sequential elements.

18. The non-transitory computer-readable storage medium of claim 16, wherein identifying the second set of state variables from the COI of the FSM involves:
identifying a second FSM within the COI of the FSM; and
including each state variable in the second FSM into the second set of state variables.

19. The non-transitory computer-readable storage medium of claim 15, wherein searching for one or more livelocks in the abstract machine involves:
   identifying an initial state in the abstract machine;
   searching, in the abstract machine, for a strongly connected component (SCC) which is forward-reachable from the initial state, wherein an SCC is a set of states wherein there is at least one path from one state to any other state in the set of states;
   if the SCC is found, determining whether the SCC is a terminal SCC (TSCC), wherein a TSCC is an SCC wherein there is no path from any state in the SCC to any state outside the SCC; and
   if so, identifying the TSCC as a livelock in the abstract machine.

20. The non-transitory computer-readable storage medium of claim 19, wherein searching for an SCC in the abstract machine further involves:
   identifying a set of initial states in the abstract machine; and
   if a first initial state in the set of initial states is forward-reachable from a second initial state in the set of initial states, eliminating the first initial state from the set of initial states so that the first initial state is not considered as an initial state when searching for the SCC.

21. The non-transitory computer-readable storage medium of claim 19, wherein searching for an SCC in the abstract machine further involves:
   identifying a set of initial states in the abstract machine; and
   if the set of initial states includes a first SCC, using at most one state in the first SCC as the initial state when searching for a second SCC which is forward-reachable from the initial state.

22. The non-transitory computer-readable storage medium of claim 15, wherein verifying that the livelock in the abstract machine is a livelock in the concrete machine involves:
   generating an abstract trace from an initial state in the abstract machine to a state in the livelock in the abstract machine;
   attempting to concretize the abstract trace to obtain a corresponding concrete trace in the concrete machine; and
   if the corresponding concrete trace can be obtained, determining that the livelock in the abstract machine is a livelock in the circuit design.

23. The non-transitory computer-readable storage medium of claim 15, wherein prior to verifying that the livelock in the abstract machine is a livelock in the concrete machine, the method further comprises identifying the COI of the FSM.

24. The non-transitory computer-readable storage medium of claim 15, wherein if a livelock is found in the abstract machine, the method further comprises:
   determining whether the livelock includes a toggle deadlock, wherein a toggle deadlock is a state of a state variable in the livelock, wherein the state variable initially toggles, but eventually sticks to a constant value; and
   if so, verifying that the toggle deadlock in the abstract machine is a toggle deadlock in the concrete machine.

25. The non-transitory computer-readable storage medium of claim 24, wherein verifying that the toggle deadlock in the abstract machine is a toggle deadlock in the concrete machine involves:
   generating an abstract trace from an initial state in the abstract machine to a state in the livelock in the abstract machine;
   attempting to concretize the abstract trace to obtain a corresponding concrete trace in the concrete machine; and
   if the corresponding concrete trace is obtained, determining that the toggle deadlock in the abstract machine is a toggle deadlock in the circuit design.

26. The non-transitory computer-readable storage medium of claim 15, wherein if a livelock is found in the abstract machine, the method further comprises determining whether the first set of state variables in the FSM contributes to the livelock.

27. An apparatus for checking a livelock in a circuit design, wherein a livelock is a set of states in the circuit design that does not have any paths to a state outside the set of states that is reachable from an initial state of the circuit design, comprising:
   a processor;
   a memory;
   an identification mechanism configured to identify a finite state machine (FSM) in the circuit design, wherein the FSM comprises a first set of state variables corresponding to a first set of sequential elements;
   a construction mechanism configured to construct an abstract machine of the circuit design, wherein the abstract machine includes the FSM and a second set of state variables corresponding to a second set of sequential elements, wherein the second set of sequential elements drive the first set of sequential elements;
   a search mechanism configured to search for one or more livelocks in the abstract machine; and
   a verification mechanism, wherein if a livelock is found in the abstract machine, the verification mechanism is configured to verify that the livelock is also present in a concrete machine of the circuit design, wherein the concrete machine includes the FSM and a third set of state variables corresponding to a third set of sequential elements, wherein the second set of state variables is a subset of the third set of state variables.

* * * * *